(12) United States Patent
Yuasa et al.

(10) Patent No.: US 11,277,908 B2
(45) Date of Patent: Mar. 15, 2022

(54) CERAMIC CIRCUIT BOARD AND METHOD FOR PRODUCING SAME

(71) Applicant: DENKA COMPANY LIMITED, Tokyo (JP)

(72) Inventors: Akimasa Yuasa, Omuta (JP); Yusaku Harada, Omuta (JP); Takahiro Nakamura, Omuta (JP); Shuhei Morita, Omuta (JP); Kouji Nishimura, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 71 days.

(21) Appl. No.: 16/616,837

(22) PCT Filed: May 29, 2018

(86) PCT No.: PCT/JP2018/020489
§ 371 (c)(1),
(2) Date: Nov. 25, 2019

(87) PCT Pub. No.: WO2018/221492
PCT Pub. Date: Dec. 6, 2018

(65) Prior Publication Data
US 2021/0176859 A1    Jun. 10, 2021

(30) Foreign Application Priority Data

May 30, 2017    (JP) .............. JP2017-106506

(51) Int. Cl.
*B21D 39/00*    (2006.01)
*H05K 1/03*    (2006.01)
(Continued)

(52) U.S. Cl.
CPC ......... *H05K 1/0306* (2013.01); *B23K 1/0016* (2013.01); *B32B 9/041* (2013.01);
(Continued)

(58) Field of Classification Search
None
See application file for complete search history.

(56) References Cited

U.S. PATENT DOCUMENTS 4,883,745 A * 11/1989 Mizuhara ........... B23K 35/3006
420/502
4,980,243 A * 12/1990 Malikowski ....... B23K 35/3006
428/621

(Continued)

FOREIGN PATENT DOCUMENTS

JP    H09-283656 A    10/1997
JP    H11-12051 A    1/1999
(Continued)

OTHER PUBLICATIONS

Aug. 21, 2018 Search Report issued in International Patent Application No. PCT/JP2018/020489.
(Continued)

*Primary Examiner* — Seth Dumbris
(74) *Attorney, Agent, or Firm* — Oliff PLC

(57) ABSTRACT

A ceramic circuit substrate having a metal plate bonded, by a bonding braze material, to at least one main surface of a ceramic substrate, wherein the bonding braze material contains, as metal components, 0.5 to 4.0 parts by mass of at least one active metal selected from among titanium, zirconium, hafnium, and niobium, with respect to 100 parts by mass, in total, of 93.0 to 99.4 parts by mass of Ag, 0.1 to 5.0 parts by mass of Cu, and 0.5 to 2.0 parts by mass of Sn; and Cu-rich phases in a bonding braze material layer structure between the ceramic substrate and the metal plate have an average size of 3.5 μm or less and a number density of 0.015/μm2 or higher. A method for producing a ceramic circuit substrate includes bonding at a temperature of 855 to 900° C. for a retention time of 10 to 60 minutes.

11 Claims, 1 Drawing Sheet

(51) Int. Cl.
*B23K 1/00* (2006.01)
*B32B 9/04* (2006.01)
*B32B 15/04* (2006.01)
*B32B 15/20* (2006.01)
*C04B 37/02* (2006.01)
*B23K 103/00* (2006.01)
*B23K 101/42* (2006.01)

(52) U.S. Cl.
CPC .............. *B32B 15/04* (2013.01); *B32B 15/20* (2013.01); *C04B 37/023* (2013.01); *B23K 2101/42* (2018.08); *B23K 2103/52* (2018.08); *B32B 2250/02* (2013.01); *B32B 2307/202* (2013.01); *B32B 2307/206* (2013.01); *B32B 2457/08* (2013.01); *C04B 2237/125* (2013.01); *C04B 2237/708* (2013.01); *Y10T 428/12903* (2015.01)

(56) References Cited

U.S. PATENT DOCUMENTS

| | | | |
|---|---|---|---|
| 6,663,982 | B1* | 12/2003 | Stephens, Jr. ...... B23K 35/3006 428/335 |
| 2004/0262367 | A1 | 12/2004 | Nakamura |
| 2014/0126155 | A1* | 5/2014 | Imamura .................. C22C 5/08 361/715 |

FOREIGN PATENT DOCUMENTS

| | | | |
|---|---|---|---|
| JP | 2003-55058 | A | 2/2003 |
| JP | 2013-173666 | A | 9/2013 |
| JP | 2014-118310 | A | 6/2014 |
| JP | 2015-65313 | A | 4/2015 |
| JP | 2016-169111 | A | 9/2016 |

OTHER PUBLICATIONS

Apr. 21, 2020 Extended Search Report issued in European Patent Application No. 18809393.4.

* cited by examiner

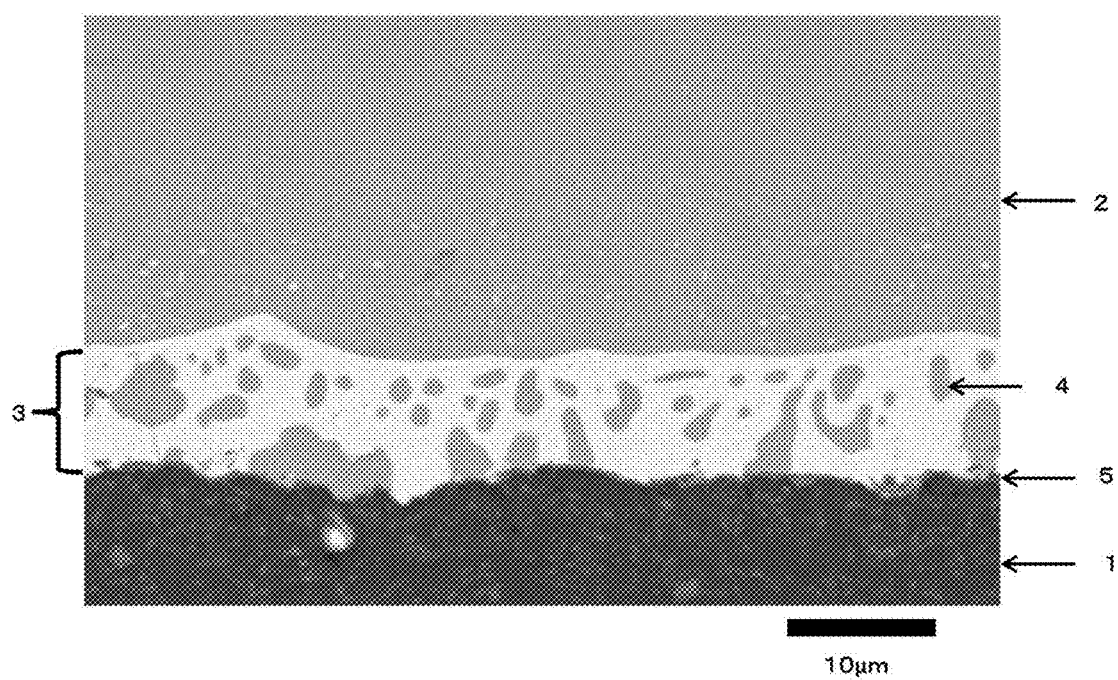

CERAMIC CIRCUIT BOARD AND METHOD FOR PRODUCING SAME

TECHNICAL FIELD

The present invention relates to a ceramic circuit substrate and a method for producing the same.

BACKGROUND

In power module applications such as elevators, vehicles, and hybrid cars, ceramic circuit substrates are used. These ceramic circuit substrates have a metal circuit board bonded, with a braze material, to the surface of a ceramic substrate composed of a ceramic such as alumina, beryllia, silicon nitride, or aluminum nitride, and have semiconductor elements further mounted at prescribed positions on the metal circuit board.

In recent years, with the higher outputs and higher integration of semiconductor elements, the amount of heat generated by semiconductor elements has been steadily increasing. In order to efficiently disperse this generated heat, ceramic substrates that are highly insulating, highly thermal conductive aluminum nitride sintered bodies, or silicon nitride sintered bodies are used.

However, there is a large difference between the thermal expansion coefficients of ceramic substrates and metal plates, and the load from repeated hot-cold cycles generates thermal stress caused by the differences in the thermal expansion coefficients at the bonding interfaces between the ceramic substrates and the metal plates. In particular, residual stress due to compression and tension acts on the ceramic substrate near the bonded portion, thus forming cracks in the ceramic substrate, leading to bonding defects or thermal resistance defects, and causing problems such as reduced operational reliability as an electronic device.

Therefore, Patent Documents 1, 2, and 3 propose methods for raising the reliability of ceramic circuit substrates by adding In, Zn, Cd, or Sn to an Ag—Cu braze material, thereby lowering the bonding temperature, thus reducing the generation of thermal stress and reducing the post-bonding residual stress.

CITATION LIST

Patent Literature

Patent Document 1: JP H9-283656 A
Patent Document 2: JP 2014-118310 A
Patent Document 3: JP 2015-065313 A

SUMMARY OF INVENTION

Technical Problem

However, in the conventional art, in order to further reduce the residual stress, 5% or more of a low-melting-point metal was blended into an Ag—Cu braze material, thereby lowering the melting point of the braze material layer, prolonging the time required for forming the Ag/Cu/low-melting-point metal structure, and resulting in a non-uniform Ag/Cu/low-melting-point metal braze material layer structure. As a result thereof, there is a problem in that, during thermal cycling resistance tests, the effect of mitigating the thermal stress generated in the ceramic circuit substrate is lowered, thus lowering the reliability of the ceramic circuit substrate. A problem addressed by the present invention is that of providing a highly reliable ceramic circuit substrate.

Solution to Problem

In order to achieve the above-mentioned objective, the present inventors adjusted ceramic circuit substrates by variously changing the amounts of chemical elements contained in the braze material for bonding the ceramic substrate and the metal circuit board, and performed a comparison study of the effects that the amounts of the chemical elements contained in the braze material have on the thermal cycling resistance properties of ceramic circuit substrates. As a result thereof, it was discovered that the thermal cycling resistance properties of ceramic circuit substrates are improved by reducing the average size of Cu-rich phases in an Ag—Cu—Sn braze material layer structure and increasing the number density of the Cu-rich phases. The present invention was completed on the basis of these discoveries.

In other words, the present invention is a ceramic circuit substrate having a metal plate bonded, by an Ag—Cu—Sn braze material, to at least one main surface of a ceramic substrate, wherein, in a 3000-times-magnified field of view in a SEM reflected-electron image of the bonding interface in a cross-section of the ceramic circuit substrate, the average size of Cu-rich phases in the Ag—Cu—Sn braze material layer structure formed continuously at the bonding interface is 3.5 μm or less, and the number density of Cu-rich phases is $0.015/\mu m^2$ or higher.

In other words, the present invention is a ceramic circuit substrate having a metal plate bonded, by a bonding braze material, to at least one main surface of a ceramic substrate, wherein the bonding braze material contains, as metal components, 0.5 to 4.0 parts by mass of at least one active metal selected from among titanium, zirconium, hafnium, and niobium, with respect to 100 parts by mass, in total, of 93.0 to 99.4 parts by mass of Ag, 0.1 to 5.0 parts by mass of Cu, and 0.5 to 2.0 parts by mass of Sn; and Cu-rich phases in a bonding braze material layer structure between the ceramic substrate and the metal plate have an average size of 3.5 μm or less and a number density of $0.015/\mu m^2$ or higher.

Advantageous Effects of Invention

According to the present invention, a highly reliable ceramic circuit substrate is provided. More specifically, the present invention provides a ceramic circuit substrate having a bonding void ratio of 1.0% or lower and further having a crack ratio of lower than 1.0% after 2000 cycles in heat cycling tests from −55° C. to 150° C.

BRIEF DESCRIPTION OF DRAWINGS

FIG. 1 shows an example of a ceramic circuit substrate having an Ag—Cu—Sn braze material layer structure in which the average size of Cu-rich phases is 3.0 μm and the number density of the Cu-rich phases is $0.016/\mu m^2$.

DESCRIPTION OF EMBODIMENTS

[Ceramic Circuit Substrate]

The ceramic circuit substrate of the present invention is a ceramic circuit substrate having a metal plate bonded, by a bonding braze material, to at least one main surface of a ceramic substrate, wherein the bonding braze material contains, as metal components, 0.5 to 4.0 parts by mass of at least one active metal selected from among titanium, zirconium, hafnium, and niobium, with respect to 100 parts by mass, in total, of 93.0 to 99.4 parts by mass of Ag, 0.1 to 5.0 parts by mass of Cu, and 0.5 to 2.0 parts by mass of Sn; and Cu-rich phases in a bonding braze material layer structure between the ceramic substrate and the metal plate have an average size of 3.5 µm or less and a number density of 0.015/µm² or higher.

The ceramic substrate that is used in the ceramic circuit substrate of the present invention is not particularly limited, and it is possible to use a nitride ceramic such as silicon nitride or aluminum nitride, an oxide ceramic such as aluminum oxide or zirconium oxide, a carbide ceramic such as silicon carbide, or a boride ceramic such as lanthanum boride. However, a non-oxide ceramic such as aluminum nitride or silicon nitride is favorable for bonding a metal plate to a ceramic substrate by active metal brazing, and furthermore, a silicon nitride substrate is preferable for the purpose of obtaining excellent mechanical strength and fracture toughness.

In one embodiment of the present invention, the thickness of the ceramic substrate is not particularly limited, but is generally about 0.1 to 3.0 mm. In particular, considering the decrease in the thermal resistance of the circuit substrate overall, it should preferably be 2.0 mm or less, and more preferably 1.2 mm or less.

In one embodiment of the present invention, it is preferable for a metal plate to be bonded to one or both main surfaces of the ceramic substrate, and the metal that is used in the metal plate is preferably copper or a copper alloy.

In one embodiment of the present invention, the thickness of the metal plate is not particularly limited, but is generally about 0.1 to 1.5 mm. In particular, in view of the heat dissipation properties, it should preferably be 0.3 mm or more, and more preferably 0.5 mm or more.

The present inventors performed diligent investigations in order to obtain excellent thermal cycling resistance properties in a ceramic circuit substrate, whereupon they discovered that the thermal cycling resistance properties of a ceramic circuit substrate are improved by making the average size of Cu-rich phases in an Ag—Cu—Sn braze material layer structure smaller and increasing the number density of Cu-rich phases. Furthermore, they discovered that, by increasing the blended amount of an Ag powder, which is the main component of the braze material, and reducing the added amount of chemical elements such as Cu and Sn, the average size of Cu-rich phases in an Ag—Cu—Sn braze material layer structure is made smaller and the number density of the Cu-rich phases is increased, and it was found that an Ag—Cu—Sn braze material layer structure having fine and uniform Cu-rich phases can be formed.

In the present embodiment, phases that are observed as being black in accordance with the composition in the Ag—Cu—Sn braze material layer structure when a reflected-electron image of a cross-section of the ceramic circuit substrate is observed under a scanning electron microscope, were defined as being Cu-rich phases. Additionally, the center-of-gravity diameters of the observed Cu-rich phases were measured and the average value thereof was defined as the average size of the Cu-rich phases.

Additionally, in the present embodiment, as an indicator representing the degree of fineness and uniformity of the above-mentioned Ag—Cu—Sn braze material layer structure, the value of the number of Cu-rich phases in the Ag—Cu—Sn braze material layer in an arbitrary cross-section of the ceramic circuit substrate divided by the area of the Ag—Cu—Sn brazing layer structure was defined as the number density of the Cu-rich phases.

The average size of the Cu-rich phases in the Ag—Cu—Sn braze material layer structure in the ceramic circuit substrate of the present invention is preferably 3.5 µm or less, more preferably 3.0 µm or less, and even more preferably 2.8 µm or less. The number density of the Cu-rich phases in the Ag—Cu—Sn braze material layer structure in the ceramic circuit substrate of the present invention is preferably 0.015/µm² or higher, more preferably 0.018/µm² or higher, and even more preferably 0.025/µm² or higher. By setting the average size of the Cu-rich phases to be 3.5 µm or less and setting the number density of the Cu-rich phases to be 0.015/µm² or less, the Ag—Cu—Sn braze material layer structure can be kept from becoming non-uniform, the effect of mitigating the thermal stress generated in the ceramic circuit substrate during thermal cycling resistance property evaluations can be kept from being reduced, and the thermal cycling resistance properties of the ceramic circuit substrate can be kept from being reduced.

Additionally, in one embodiment of the present invention, the bonding void ratio in the ceramic circuit substrate is preferably 1.0% or lower, more preferably 0.8% or lower, and even more preferably 0.5% or lower.

Furthermore, the crack ratio in the ceramic circuit substrate according to one embodiment of the present invention, after 2000 cycles in heat cycling resistance tests from −55° C. to 150° C., is preferably lower than 1.0%, more preferably 0.8% or lower, and even more preferably 0.5% or lower.

In one embodiment of the present invention, the braze material is composed of an Ag—Cu—Sn braze material such that the braze material layer contains at least one active metal selected from among titanium, zirconium, hafnium, and niobium. By controlling the formation of the Cu-rich phases in the Ag—Cu—Sn braze material layer structure mainly based on the melting of copper from the metal plate into the braze material, it is possible to form a fine and uniform Ag—Cu—Sn braze material layer structure. It is desirable for the blending ratio of the Ag—Cu—Sn braze material to be a blending ratio at which fine Cu-rich phases are easily formed. In particular, it is preferable for the blend (93.0 to 99.4 parts by mass of Ag powder, 0.1 to 5.0 parts by mass of Cu powder, and 0.5 to 2.0 parts by mass of Sn powder in 100 parts by mass, in total, of the Ag powder, the Cu powder, and the Sn powder) to take into consideration the fact that copper from the metal plate will be melted in.

As the aforementioned Ag powder, it is possible to use an Ag powder having a specific surface area of 0.1 to 0.5 m²/g. If an Ag powder having a specific surface area greater than 0.5 m²/g is used, then the powder may tend to aggregate and the oxygen concentration may become high, and this may lead to bonding defects. Additionally, by using an Ag powder having a specific surface area of 0.1 m²/g or higher, the Ag—Cu—Sn braze material layer structure can be kept from becoming non-uniform and the reliability of the ceramic circuit substrate can be kept from decreasing. Additionally, the specific surface area can be measured by using a gas adsorption method.

In one embodiment of the present invention, the Cu powder contained in the braze material powder is a component for improving the melting properties of the Ag—Cu—Sn braze material, and the blended amount thereof is preferably 0.1 to 5.0 parts by mass. By setting the blended amount of the Cu powder to be 0.1 parts by mass or more, the melting properties of the braze material can be kept from being reduced and the possibility of leading to bonding defects can be suppressed. Additionally, by setting the blended amount of the Cu powder to be 5.0 parts by mass or less, the average size of the Cu-rich phases in the Ag—Cu—Sn brazing layer structure can be kept from becoming large, the effect of mitigating the thermal stress generated in the ceramic circuit substrate during thermal cycling resistance evaluations can be kept from being reduced, and the reliability of the ceramic circuit substrate can be kept from decreasing.

In one embodiment of the present invention, the Sn powder contained in the braze material powder is a component for making the contact angle of the braze material with respect to the ceramic substrate smaller, and improving the wettability of the braze material. The blended amount thereof is preferably 0.5 to 2.0 parts by mass. By setting the blended amount of the Sn powder to be 0.5 parts by mass or more, the wettability with respect to the ceramic substrate can be kept from being reduced and the possibility of leading to bonding defects can be suppressed. By setting the blended amount of the Sn powder to 2.0 parts by mass or less, the average size of the Cu-rich phases in the Ag—Cu—Sn braze material layer structure can be kept from becoming large, the effect of mitigating the thermal stress generated in the ceramic circuit substrate during thermal cycling resistance evaluations can be kept from being reduced, and the reliability of the ceramic circuit substrate can be kept from decreasing.

In one embodiment of the present invention, there are preferably 0.5 to 4.0 parts by mass of the active metal contained in the braze material relative to 100 parts by mass, in total, of the Ag powder, the Cu powder, and the Sn powder. By setting the active metal content to be 0.5 parts by mass or more, the wettability between the ceramic substrate and the braze material can be kept from becoming poor and bonding defects can be kept from readily occurring. On the other hand, by setting the active metal content to be 4.0 parts by mass or less, a brittle alloy layer can be kept from forming at the bonding interface with the low-melting-point metal, and the thermal cycling resistance can be kept from being reduced. The active metal may be selected from among metals such as titanium, zirconium, hafnium, and niobium, and hydrides thereof, among which titanium and titanium hydride are preferred.

In one embodiment of the present invention, the thickness of the braze material is preferably 5 to 40 µm by a dry standard. By setting the braze material thickness to be 5 µm or more, the formation of the liquid phase can be kept from being inadequate and the generation of many bonding voids can be suppressed. On the other hand, by setting the braze material thickness to be 40 µm or less, the time required for removing the bonding layer can be kept from being too long and the productivity can be kept from being reduced. The coating method is not particularly limited, and a generally known coating method by which the substrate surface can be uniformly coated, such as screen printing or roller coating, may be employed.

[Method for Producing Ceramic Circuit Substrate]

The method for producing the ceramic circuit substrate of the present invention involves bonding at a bonding temperature of 855 to 900° C. and for a retention time of 10 to 60 minutes. In one embodiment of the present invention, the bonding between the ceramic substrate and the metal plate preferably involves bonding in a vacuum at a temperature of 855 to 900° C. and for a time of 10 to 60 minutes. By setting the bonding temperature to be 855° C. or higher and the retention time to be 10 minutes or longer, the melt-in of Cu from the metal plate can be kept from being insufficient and the bonding properties of the ceramic substrate with the metal plate can be kept from being reduced. On the other hand, by setting the bonding temperature to be 900° C. or lower and the retention time to be 60 minutes or shorter, thermal stress caused by the thermal expansion coefficient difference at the time of bonding can be kept from increasing, and the reliability of the ceramic circuit substrate can be kept from decreasing.

In one embodiment of the present invention, the metal plate is coated with an etching resist and etched in order to form a circuit pattern on the circuit substrate. There are no particular restrictions regarding the etching resist, and for example, a commonly used UV-cured type or a thermally cured type may be used. There are no particular restrictions on the etching resist coating method, and for example, a generally known coating method such as screen printing may be employed.

In one embodiment of the present invention, the metal plate is etched in order to form a circuit pattern. There are no particular restrictions on the etching solution, and it is possible to use a commonly used ferric chloride solution or cupric chloride solution, sulfuric acid, hydrogen peroxide water, or the like, among which a ferric chloride solution or a cupric chloride solution is preferred. A nitride ceramic circuit substrate from which unnecessary metal portions have been removed by etching has the coated braze material, and alloy layers, nitride layers, and the like thereof still remaining, and it is common to remove these by using a solution containing an aqueous ammonium halide solution, an inorganic acid such as sulfuric acid or nitric acid, or hydrogen peroxide water. After the circuit is formed, the etching resist is stripped. The stripping method is not particularly limited, and a method of immersion in an alkaline aqueous solution is common.

EXAMPLES

Hereinafter, the present invention will be explained in detail by referring to examples. However, the scope of the present invention is not limited to the examples below.

Example 1

An active metal braze material containing 3.5 parts by mass of a titanium hydride powder (TCH-100, manufactured by Toho Technical Service Co., Ltd.) relative to 100 parts by mass, in total, of 99.0 parts by mass of an Ag powder (Ag-HWQ 2.5 µm, manufactured by Fukuda Metal Foil & Powder Co., Ltd.), 0.5 parts by mass of a Cu powder (Cu-HWQ 3 µm, manufactured by Fukuda Metal Foil & Powder Co., Ltd.), and 0.5 parts by mass of an Sn powder (Sn-HPN 3 µm, manufactured by Fukuda Metal Foil & Powder Co., Ltd.), was coated, by screen printing, onto a 0.32 mm-thick silicon nitride substrate, such that the coated amount was 8 mg/cm$^2$. Thereafter, a circuit-forming metal plate was placed over one surface of the silicon nitride substrate and a heat dissipation plate-forming metal plate (both being C1020 oxygen-free copper plates having a thickness of 0.8 mm and a purity of 99.60%) was placed over the other surface, and these were bonded at 890° C. for 20 minutes. An etching resist was printed on the bonded copper plate and the copper plate was etched with a cupric chloride solution to form a circuit pattern. Furthermore, the braze material layers and nitride layers were removed with an ammonium fluoride/hydrogen peroxide solution.

<Bonding Void Ratio>

The bonding void ratio of the ceramic circuit substrate observed by an ultrasonic flaw detector (ES5000, manufactured by Hitachi Power Solutions Co., Ltd.) was computed by measuring the area of bonding voids and dividing this value by the area of the copper circuit pattern.

<Observation of Cu-Rich Phases in Ag—Cu—Sn Braze Material Layer Structure>

The Cu-rich phases in the Ag—Cu—Sn braze material layer structure were evaluated by using a scanning electron microscope (JEOL Ltd. JSM-6380) to observe three fields of view at 3000-times magnification, the fields of view being 60 μm long and 80 μm wide, in reflected-electron images at arbitrary positions at the bonding interface in a cross-section of the ceramic circuit substrate. Due to this method, it is possible to observe Cu-rich phases having a grain size of 0.1 μm or more. If the observation magnification is set to a magnification that is too high, then the field of view becomes small and a sufficient number of Cu-rich phases cannot be observed. Conversely, if the magnification is too low, then Cu-rich phases smaller than 1 μm cannot be observed. Thus, the magnification was set to 3000-times magnification.

<Evaluation of Cu-Rich Phases in Ag—Cu—Sn Braze Material Layer Structure>

SEM images obtained by the aforementioned method were analyzed and measured. As the software for image analysis, the image processing software Image-Pro Plus manufactured by Media Cybernetics was used. There were Cu-rich phases of various grain sizes, from 0.3 μm to several μm, in the Ag—Cu—Sn braze material layer structure of the present invention, and analyses were performed on Cu-rich phases having an observable grain size of 0.1 μm or more, using a scanning electron microscope. The average size of the Cu-rich phases was the average value obtained after observing three fields of view and measuring the center-of-gravity diameters of all of the observed Cu-rich phases. Additionally, regarding the number density of the Cu-rich phases, the image analysis software Image-Pro Plus was used to measure the area of the Ag—Cu—Sn braze material layer structure, and the number density of the Cu-rich phases was determined by using Expression (I) below.

Cu-rich phase number density (number/$\mu m^2$)=number of Cu-rich phases/area of Ag—Cu—Sn braze material layer structure  (I)

<Evaluation of Heat Cycling Resistance>

A fabricated ceramic circuit substrate was repeatedly tested over 2000 cycles in heat cycling resistance tests wherein each cycle involved setting the temperature so as to change between −55° C. for 15 minutes, 25° C. for 15 minutes, 150° C. for 15 minutes, and 25° C. for 15 minutes. Thereafter, the metal plate and the braze material layer were stripped with iron chloride and an ammonium fluoride/hydrogen peroxide etching solution, and the area of horizontal cracks generated at the surface of the ceramic substrate was determined by using a scanner to input an image at a resolution of 600 dpi×600 dpi, using the image analysis software GIMP2 (threshold value 140) to digitize the image, then computing the horizontal crack area. This was divided by the copper circuit pattern area to determine the horizontal crack ratio.

Examples 2 to 12

The same procedure as in Example 1 was performed, except that the conditions shown in Table 1 were used.

Comparative Example 1

A ceramic circuit substrate was obtained in a manner similar to Example 1 aside from the fact that a Cu powder and an Sn powder were not contained in the braze material used for bonding.

Comparative Examples 2 to 6

The same procedure as in Example 1 was performed, except that the conditions shown in Table 1 were used.

TABLE 1

| | Braze Material Metal Component (parts by mass) | | | | Bonding Conditions | | Ceramic Circuit Substrate | | | |
|---|---|---|---|---|---|---|---|---|---|---|
| | Ag | Cu | Sn | TiH$_2$ | Bonding Temp (° C.) | Retention Time (min) | Average Size Cu-rich Phases (μm) | Number Density Cu-rich Phases (/$\mu m^2$) | Bonding Void Ratio (area %) | Horizontal Crack Ratio (area %) |
| Example 1 | 99.0 | 0.5 | 0.5 | 3.5 | 890 | 20 | 2.4 | 0.030 | 0.8 | 0.4 |
| Example 2 | 98.5 | 0.5 | 1.0 | 3.5 | 870 | 20 | 2.7 | 0.026 | 0.2 | 0.1 |
| Example 3 | 97.5 | 0.5 | 2.0 | 3.5 | 870 | 20 | 3.3 | 0.016 | 0.1 | 0.4 |
| Example 4 | 98.5 | 0.5 | 1.0 | 3.5 | 890 | 20 | 2.5 | 0.024 | 0.2 | 0.7 |
| Example 5 | 97.5 | 0.5 | 2.0 | 3.5 | 880 | 20 | 3.4 | 0.017 | 0.2 | 0.8 |
| Example 6 | 98.5 | 0.5 | 1.0 | 3.5 | 890 | 11 | 2.8 | 0.027 | 0.4 | 0.4 |
| Example 7 | 98.5 | 0.5 | 1.0 | 3.5 | 860 | 55 | 2.6 | 0.026 | 0.1 | 0.7 |
| Example 8 | 98.5 | 0.5 | 1.0 | 1.0 | 865 | 30 | 2.7 | 0.028 | 0.8 | 0.5 |
| Example 9 | 98.0 | 0.5 | 1.5 | 4.0 | 880 | 30 | 2.5 | 0.026 | 0.1 | 0.7 |
| Example 10 | 97.5 | 1.5 | 1.0 | 3.0 | 870 | 20 | 3.0 | 0.019 | 0.5 | 0.5 |
| Example 11 | 96.0 | 3.0 | 1.0 | 3.5 | 880 | 55 | 3.3 | 0.017 | 0.1 | 0.8 |
| Example 12 | 93.0 | 5.0 | 2.0 | 3.5 | 890 | 55 | 3.5 | 0.015 | 0.1 | 0.9 |
| Comparative Example 1 | 100.0 | 0.0 | 0.0 | 3.5 | 890 | 20 | 2.1 | 0.050 | 5.0 | 0.3 |
| Comparative Example 2 | 94.5 | 0.5 | 5.0 | 3.5 | 890 | 20 | 5.2 | 0.011 | 0.0 | 1.6 |
| Comparative Example 3 | 89.0 | 10.0 | 1.0 | 3.5 | 890 | 20 | 4.9 | 0.012 | 0.3 | 1.5 |
| Comparative Example 4 | 97.5 | 0.5 | 2.0 | 3.5 | 930 | 30 | 6.5 | 0.012 | 0.0 | 2.5 |
| Comparative Example 5 | 98.5 | 0.5 | 1.0 | 3.5 | 870 | 120 | 7.3 | 0.012 | 0.1 | 1.9 |
| Comparative Example 6 | 98.5 | 0.5 | 1.0 | 0.3 | 830 | 30 | 2.6 | 0.023 | 3.2 | 1.4 |

When bonding a metal plate to a silicon nitride substrate, by blending 0.5 to 4.0 parts by mass of titanium hydride with respect to 100 parts by mass, in total, of 93.0 to 99.4 parts by mass of an Ag powder, 0.1 to 5.0 parts by mass of a Cu powder, and 0.5 to 2.0 parts by mass of an Sn powder, and bonding at a temperature of 855 to 900° C. for a retention time of 10 to 60 minutes, a ceramic circuit substrate having a horizontal crack ratio of 1.0% or lower in thermal cycling resistance evaluations was obtained.

REFERENCE SIGNS LIST

1 Ceramic substrate
2 Metal plate
3 Ag—Cu—Sn braze material layer structure
4 Cu-rich phase
5 Bonding interface

The invention claimed is:

1. A ceramic circuit substrate having a metal plate bonded, by a bonding braze material, to at least one main surface of a ceramic substrate, wherein the bonding braze material contains, as metal components, 0.5 to 4.0 parts by mass of at least one active metal selected from among titanium, zirconium, hafnium, and niobium, with respect to 100 parts by mass, in total, of 93.0 to 99.4 parts by mass of Ag, 0.1 to 5.0 parts by mass of Cu, and 0.5 to 2.0 parts by mass of Sn; Cu-rich phases in a bonding braze material layer structure between the ceramic substrate and the metal plate have an average size of 3.5 μm or less and a number density of 0.015 μm$^2$ or higher; and a bonding void ratio in the ceramic circuit substrate is 1.0% or lower.

2. A method for producing the ceramic circuit substrate according to claim 1, wherein the method involves bonding at a bonding temperature of 855 to 900° C. and for a retention time of 10 to 60 minutes.

3. The ceramic circuit substrate according to claim 1, wherein the average size is 3.0 μm or less.

4. The ceramic circuit substrate according to claim 1, wherein the average size is 2.8 μm or less.

5. The ceramic circuit substrate according to claim 1, wherein the number density is 0.018/μm$^2$ or higher.

6. The ceramic circuit substrate according to claim 1, wherein the number density is 0.025/μm$^2$ or higher.

7. The ceramic circuit substrate according to claim 1, wherein the bonding void ratio in the ceramic circuit substrate is 0.8% or lower.

8. The ceramic circuit substrate according to claim 1, wherein the bonding void ratio in the ceramic circuit substrate is 0.5% or lower.

9. The ceramic circuit substrate according to claim 1, wherein a crack ratio in the ceramic circuit substrate after 2000 cycles in heat cycling resistance tests from −55° C. to 150° C., is lower than 1.0%.

10. The ceramic circuit substrate according to claim 1, wherein a crack ratio in the ceramic circuit substrate after 2000 cycles in heat cycling resistance tests from −55° C. to 150° C., is 0.8% or lower.

11. The ceramic circuit substrate according to claim 1, wherein a crack ratio in the ceramic circuit substrate after 2000 cycles in heat cycling resistance tests from −55° C. to 150° C., is 0.5% or lower.

* * * * *